(12) United States Patent
Swedo et al.

(10) Patent No.: US 7,319,131 B2
(45) Date of Patent: *Jan. 15, 2008

(54) PHENOLIC RESINS

(75) Inventors: Raymond J. Swedo, Mount Prospect, IL (US); George David Green, Cary, IL (US)

(73) Assignee: Angus Chemical Company, Buffalo Grove, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/900,557

(22) Filed: Jul. 28, 2004

(65) Prior Publication Data

US 2005/0054787 A1  Mar. 10, 2005

Related U.S. Application Data

(63) Continuation-in-part of application No. 10/830,808, filed on Apr. 23, 2004, which is a continuation-in-part of application No. 10/383,272, filed on Mar. 7, 2003, now abandoned.

(51) Int. Cl.
*C08G 8/10* (2006.01)
*C08G 14/04* (2006.01)
*C08G 14/06* (2006.01)
*C08F 283/00* (2006.01)

(52) U.S. Cl. .................. 528/129; 528/145; 525/534; 524/540; 524/541; 548/517

(58) Field of Classification Search ............... 528/129, 528/145; 525/534; 524/540, 541; 548/517
See application file for complete search history.

(56) References Cited

U.S. PATENT DOCUMENTS

| | | | |
|---|---|---|---|
| 2,607,759 A | 8/1952 | Yourtee | ............ 260/67.6 |
| 3,305,413 A | 2/1967 | Flynn et al. | |
| 4,250,267 A | 2/1981 | Hartdegen et al. | |
| 4,267,322 A | 5/1981 | Wiezer | ............ 544/180 |
| 5,684,114 A * | 11/1997 | Phillips et al. | ............ 528/129 |
| 2001/0041782 A1 | 11/2001 | Okuhira et al. | |
| 2002/0183461 A1 | 12/2002 | Okuhira et al. | |
| 2004/0198926 A1 | 10/2004 | Swedo | |
| 2005/0009980 A1 | 1/2005 | Swedo | |
| 2007/0055041 A1 | 3/2007 | Swedo | |

FOREIGN PATENT DOCUMENTS

| | | |
|---|---|---|
| EP | 0 666 296 A | 8/1995 |
| EP | 0705856 | 4/1996 |
| WO | WO97/18251 A | 5/1997 |

OTHER PUBLICATIONS

Derwent Abstract 2000-102233 JP 11343384 A (Sumitomo Bakelite Co Ltd), May 29, 1998.
Derwent Abstract AN 1979-53365B for JP 54071120.

* cited by examiner

Primary Examiner—Duc Truong

(57) ABSTRACT

The invention herein disclosed comprises the use of oxazolidines, nitroalcohols, nitrones, halonitroparaffins, oxazines, azaadamantanes, hexamethylenetetramine salts, nitroamines, imidazolidines, triazines, nitrooxazolidines, and imidazolidine-oxazolidine hybrids to serve as hardeners for curing phenolic resins. The hardeners and accelerators/catalysts described in the invention can be applied in any application where phenolic resins are used, including but not limited to fiber reinforced composite applications such as pultrusion, filament winding, bulk molding compound (BMC), sheet molding compounds (SMC), vacuum assisted resin transfer, prepregs, adhesives, foundry materials, abrasives, friction materials, insulation, laminates, coatings, electronics, fire resistant, and flame-retardant end uses.

29 Claims, No Drawings

PHENOLIC RESINS

This application is a continuation-in-part of U.S. patent application Ser. No. 10/830,808 filed Apr. 23, 2004 now pending, which is a continuation-in-part of U.S. patent application Ser. No. 10/383,272 filed Mar. 7, 2003 now abandoned.

BACKGROUND OF THE INVENTION

1. Field of the Invention

The invention is directed toward compositions which are useful as hardeners for phenolic novolac resins.

2. Description of the Prior Art

Phenolic resins can be broadly divided into two general classes: novolacs and resoles. Novolac resins are generally characterized as being formaldehyde deficient. That is to say that the ratio of formaldehyde to phenolic groups is <1. Resole resins are generally characterized as being formaldehyde rich. That is to say that the ratio of formaldehyde to phenolic groups is >1. Both novolacs and resoles may incorporate a variety of phenolic compounds, alone or in combination, including but not limited to phenol, resorcinol, bisphenols, phloroglucinol, cresols, alkyl phenols, phenyl ethers, tannins, and lignins. Similarly, other aldehydes may be substituted in whole or in part for formaldehyde, including but not limited to acetaldehyde, propionaldehyde, cyclohexanedicarboxaldehydes, benzaldehydes, furfural, and other aryl or heterocyclic aldehydes.

Novolac resins are usually cured (crosslinked, hardened) through the use of formaldehyde, formaldehyde-donating hardener compounds, or formaldehyde equivalent compounds. Hexa-methylenetetramine (hexa) and paraformaldehyde are often used commercially to cure novolac resins. In addition to a source of formaldehyde, heating and the presence of a catalyst are usually employed to accelerate the rate and extent of curing. Catalysts may include inorganic bases such as calcium, sodium or potassium hydroxide, or calcium or magnesium oxide, Lewis acids such as zinc chloride or zinc acetate, or amines such as triethylamine.

Resoles, being formaldehyde rich, do not require additional formaldehyde to effect curing. Heat alone or heating in the presence of a catalyst—usually an acid—are all that are required.

SUMMARY OF INVENTION

The invention herein disclosed comprises the use of oxazolidines (OX), nitroalcohols (NA), nitrones (NIT), halonitroparaffins (HNP), oxazines (OZ), azaadamantanes (AZA), hexamethylenetetramine salts (HEX-S), nitroamines (NAm), imidazolidines (ImA), triazines (TRI), nitrooxazolidines (NIT-OX), and imidazolidin-oxazolidine hybrids (ImA-OX) to serve as hardeners and/or as catalysts for curing phenolic novolac resins. These hardeners include both completely new compositions as well as known compounds found to have unexpected activity. These hardeners are effective in curing a wide range of phenolic resins. The activity of these hardeners may be further enhanced through the incorporation of bases such as inorganic hydroxides or oxides such as but not limited to NaOH, KOH, LiOH, Ca(OH)$_2$, Mg(OH)$_2$, CaO; amines such as but not limited to trimethylamine (TMA), triethylamine (TEA), 2-(dimethylamino)-2-(hydroxymethyl)-1,3-propanediol (DMTA), 1,1,3,3-tetramethylguanidine (TMG), tetramethylammonium hydroxide, tetraethylammonium hydroxide, tetrabutylammonium hydroxide, 1,4-diazabicyclo[2.2.2]octane (Dabco™), 1,8-diazabicyclo[5.4.0]undec-7-ene (DBU), 1,5-diazabicyclo[4.3.0]non-5-ene (DBN), or metal alkoxides such as but not limited to sodium methoxide, sodium ethoxide, potassium methoxide, potassium ethoxide, potassium t-butoxide, sodium phenoxide, and potassium phenoxide. Through the judicious selection of these hardeners and accelerators/catalysts, used either alone or in various combinations, it is possible to advantageously vary the processing parameters for curing these phenolic resin systems. Lower curing temperatures, controlled curing rates, and reduced post-cure cycles are advantageous improvements as compared to standard hexa-cured novolac or acid-catalyzed resole systems. These process improvements and reduction in cycle time have obvious economic benefits.

The hardeners and catalysts described in this invention can be applied in any application where phenolic resins are used, including but not limited to fiber reinforced composite applications such as pultrusion, filament winding, bulk molding compound (BMC), sheet molding compounds (SMC), vacuum assisted resin transfer, prepregs, adhesives, foundry materials, abrasives, friction materials, insulation, laminates, coatings, electronics, fire resistant, and flame-retardant end uses.

DETAILED DESCRIPTION OF INVENTION

The invention also includes novel curing agents, i.e., hardeners and catalysts, drawn from a wide variety of existing and new oxazolidines (OX), nitroalcohols (NA), nitroacetals (NAc), nitrones (NIT), halonitroparaffins (HNP), oxazines (OZ), azaadamantanes (AZA), hexamethylenetetramine salts (HEX-S), nitroamines (NAm), imidazolidines (ImA), nitroimidazolidines (NIT-ImA), triazines (TRI), nitrooxazolidines (NIT-OX), and imidazolidine-oxazolidine hybrids (ImA-OX) as described below. The hardeners and catalysts are selected from the group consisting of 5-(2-furyl)-3-ethyl-3-hydroxymethyl-oxazolidine (FUR/monoZE), 5-ethyl-1,8-di(2-furyl)-1-aza-3,7-dioxabicyclo[3.3.0]octane (FUR/ZE), 5-nitro-5-[(N-isopropyl)-aminomethyl]-3-isopropyl-1,3-tetrahydrooxazine (IPA-OZ), 7-nitro-1,3,5-triazaadamantane (NTA), 7-amino-1,3,5-triazaadamantane (ATA), hexamethylenetetramine/bromonitromethane salt (HEX-BNM), hexamethylenetetramine/benzyl chloride salt (HEX-BzCl), 2-furfural-IPHA nitrone (Fur-IPHA), terephthalaldehyde-, glyoxal- and glutaraldehyde-based bis-nitrones from hydroxylamines, including hydroxylamine (HA), N-isopropylhydroxylamine (IPHA), N-propylhydroxylamine (PHA), N-ethylhydroxylamine (EHA), and N-t-butylhydroxylamine (tBuHA), nitroamine N-(2-nitroisobutyl)aniline (NMP-An), 1-imidazolidineethanol (ImE), 3-oxazolidineethanol (3OE), 3-phenyloxazolidine (3POX), 1-oxo-3,5-diaza[1.2.4]bicyclononane (ODB), 3,3'-(2-methyl-2-nitro-1,3-propanediyl) bis[4,4-dimethyloxazolidine](NMPD-bis-1135), 4,4-dimethyl-1-oxa-3-[N-(2-hydroxymethyl-2-nitropropy10] azacyclopentane (NMPD-1135), 3,3'-methylenebisoxazolidine (bis-OX), 1,3,5-tris(2-hydroxyethyl)hexahydro-1,3,5-triazine (TRI), oxazolidine (OX), 1-aza-3,7-dioxabicyclo[3.3.0]octane (SER-OX), 4-ethyloxazolidine (AB-OX), 1,3-dipheylimidazolidine (DPI).

It will be obvious to those skilled in the art that the amount of hardener used to cure a phenolic novolac resin will vary according to the mechanical properties one wishes to achieve and to the application process being practiced. Achieving a crosslink density of 50% of the available resin sites would appear to be prudent, but levels of from 10% to 100% could be attained as needed. The use levels for hexa in commercial compression molding applications can vary from about 5 wt. % to 15 wt. % or even higher to achieve the levels of crosslink density needed for specific applications.

The new hardeners disclosed herein are derived from a wide variety of chemical classes. In most cases, it will be most advantageous to utilize these hardeners as isolated components, free of solvents and reaction by-products, much as described in the Examples herein. They may be used as the crude, isolated products or after further purification. Factors determining the extent of purification needed include economics, an ability to determine accurately the level of active component present, and a knowledge that the inactive components will not interfere with the curing reaction.

Also within the scope of this invention are hardeners or mixtures of hardeners generated in situ from their reactive components. For example, 2-amino-2-ethyl-1,3-propanediol (AEPD®) reacts readily at or near room temperature with a formaldehyde source (aqueous formaldehyde solution, paraformaldehyde, or formaldehyde in organic solvent, such as Formcel®) to form the oxazolidine Bioban® CS-1246 (ZE). The oxazolidine may be isolated from such a reaction for use as a hardener as described above. Alternatively, a mixture containing the appropriate levels of AEPD® and a formaldehyde source, with or without solvents, can be admixed with a phenolic novolac resin and subsequently cured, the active oxazolidine hardener component being generated in situ. Similarly, a diamine such as aminoethylethanolamine (AEEA) reacts readily with formaldehyde sources as described above to generate the imidazolidine 1-imidazolidineethanol. A mixture of AEEA and the appropriate level of a formaldehyde source, with or without solvent, can be admixed with a phenolic novolac resin and subsequently cured, the reactive imidazolidine hardener being generated in situ.

In addition to monomeric hardener species, the use of polymeric hardeners also lies within the scope of this invention. For example, by the reaction of polyalkyleneamines, such as Dow Heavy Polyamine X, with a formaldehyde source reactive compounds containing multiple imidazolidine units per molecule may be obtained. These hardeners may either be employed as isolated components, or they may be generated in situ as described above.

It will be readily apparent to those skilled in the art that the crosslinking potential of each hardener will vary according to specific structures. Recommended use levels for these new hardeners will therefore cover a very broad range. In general, sufficient hardener should be used in order to achieve crosslink densities of from 10% to 100%, and preferably from about 50% to 80%. This will require the incorporation of from as little as 5 wt. % based on total formulation weight for highly functionalized, low molecular weight hardeners, to >75 wt. % based on total formulation weight for high molecular weight hardeners having low functionality.

The new hardeners disclosed herein may be used either alone or in various combinations to achieve fully cured phenolic novolac resins under a variety of applications. However, if desired, the curing properties of these hardeners may be enhanced by the additional incorporation of accelerators/catalysts. The materials seen to be effective with the new hardeners disclosed herein are typically basic, but are drawn from a broad variety of chemical classes including both inorganic and organic compounds. The activity of some of these compounds may be truly catalytic, while that of others may in fact be stoichiometric. For this reason, they are collectively referred to herein as accelerators/catalysts. In any case, the effect of these accelerators/catalysts is to lower curing onset and peak temperatures, as seen by DSC analyses. Therefore, these accelerators/catalysts may be used to increase rates of curing at a given temperature, or to effect curing of a formulation at a lower temperature.

Inorganic compounds effective as accelerators/catalysts with the new hardeners disclosed herein include but are not limited to metal hydroxides and oxides such as sodium hydroxide, potassium hydroxide, lithium hydroxide, calcium hydroxide, magnesium hydroxide, and calcium oxide. Organic compounds effective as accelerators/catalysts with the new hardeners disclosed herein include but are not limited to amines such as trimethylamine, triethylamine, 2-(dimethylamino)-2-(hydroxymethyl)-1,3-propanediol, 1,1,3,3-tetramethylguanidine, tetramethylammonium hydroxide, tetraethylammonium hydroxide, tetrabutylammonium hydroxide, 1,4-diazabicyclo[2.2.2]octane, 1,8-diazabicyclo[5.4.0]undec-7-ene, 1,5-diazabicyclo[4.3.0]non-5-ene, or metal alkoxides such as but not limited to sodium methoxide, sodium ethoxide, potassium methoxide, potassium ethoxide, potassium t-butoxide, sodium phenoxide, and potassium phenoxide.

Use levels of these accelerators/catalysts will vary greatly depending upon choice of compound, the activity of that compound, and the level and kind of curing enhancement to be achieved. Accelerator/catalyst levels of from 0.5 wt. % based on total formulation weight to as high as 15 wt. % based on total formulation weight could be used. Preferred accelerator/catalyst levels would be 1 to 5 wt. % based on total formulation weight.

Although not essential in some applications, the use of solvents can be advantageous in controlling formulation viscosity and/or improve handling and processing. The litany of solvents commonly employed by those skilled in the art include water, the common alcohols, glycols, glycol ethers, glycol esters, ketones, and aliphatic esters and need not be elaborated upon here. It is obvious that the solvent chosen should not be reactive with the resin, hardener, or accelerator/catalyst so as not to impair shelf life, pot life, or curing. It is also known that the use of inert solvents can lead to residual voids in the cured phenolic resin, thus reducing mechanical properties. Therefore, it is desirable to keep the levels of inert solvents as low as possible to achieve processability. By using the new hardeners disclosed herein, easily processable formulations containing <20 wt. % of solvent based on total formulation weight are attainable.

As noted above, the use of inert solvents can lead to voids in the cured phenolic resin product. This problem can be addressed in some cases by the choice of appropriate hardeners in which the use of inert solvents can be eliminated. In other cases, void production can be reduced or eliminated by replacing inert solvents in whole or in part by reactive diluents. By definition, a reactive diluent is a compound that is typically a liquid that can act as a solvent for the resin, hardener, and, optionally, accelerator/catalyst. In addition, it is also a compound that is co-reactive with the resin and/or the hardener, and thus is incorporated into the cured phenolic resin. Suitable reactive diluents for these applications include but are not limited to phenol, the cresols, resorcinol, and aniline and alkyl, hydroxyalkyl, or alkyl ether derivatives of these compounds; furfural, and furfuryl alcohol.

Because they are fully reacted into the cured resin, reactive diluents can be used to achieve 100% solids formulations. The levels of reactive diluents employed may thus vary greatly, from 1 wt. % based on total formulation weight to >50 wt. % based on total formulation weight. If reactive diluents are employed, it is obvious that the levels of hardeners must be adjusted accordingly.

EXAMPLES

Oxazolidines Bioban® CS-1246 (5-ethyl-1-aza-3,7-dioxabicyclo[3.3.0]octane, ZE), Bioban® CS-1135 (4,4-dimethyl-1-oxa-3-azacyclopentane), Bioban® CS-1991 (5-methyl-1-aza-3,7-dioxabicyclo[3.3.0]octane, the nitroalcohol tris(hydroxymethyl)nitromethane (TN®), aminoalcohol 2-amino-2-ethyl-1,3-propanediol (AEPD®), the nitroparaffins nitromethane (NM®), nitroethane (NE®), 1-nitropropane (1-NP), 2-nitropropane (2-NP), the hydroxylamines N-isopropylhydroxylamine (IPHA), N-ethylhydroxylamine (EHA), and N-propyl-hydroxylamine (PHA) were all obtained from the ANGUS Chemical Company. The isopropylamine (IPA), hexamethylenetetramine (hexa), 2-furfural, aqueous formaldehyde solution, benzyl chloride, glyoxal, glutaraldehyde, 1,1,3,3-tetramethylguanidine (TMG), tetramethylammonium hydroxide (25 wt. % in methanol) (TMAOH), and all common laboratory acids, bases, solvents, and reagents were obtained from the Aldrich Chemical Company. 5-Hydroxymethyl-1-aza-3,7-dioxabicyclo [3.3.0]octane (M-3P) was obtained from Uniroyal. 2-Bromo-2-nitro-1,3-propanediol (Bronopol) was obtained from Dow Biocides. Aminoethylethanolamine (AEEA) was obtained from the Dow Chemical Company. Formcel® (55 wt. % formaldehyde in methanol) was obtained from Celanese. The phenolic novolac resins were commercially available materials from obtained from resin manufacturers. Other materials were synthesized as indicated below.

GC Analyses:

GC analyses were performed using a Hewlett Packard Model 5890A gas chromatograph with FID detector on a 30 meter×0.25 mm 1 µ film DB-5 column.

IR Analyses:

IR analyses were performed using a Nicolet Model 560 FT/IR. Samples were analyzed in the form of KBr pellets or as thin films on NaCl plates, as appropriate.

NMR Analyses:

NMR analyses were conducted using an IBM NR/200 FT/NMR. Both $^1H$ and $^{13}C$ probes were used. Deuterated solvents were chosen to match the solubility properties of the sample.

GC/MS Analyses:

GC/MS analyses were conducted using a Hewlett Packard Model HP6890 GC coupled to an Agilent Model 5973 MS. Both EI and CI methods were used.

DSC Analyses:

DSC analyses were performed using a TA Instruments Model Q100 differential scanning calorimeter. Scans for screening hardeners with novolac resins were run from 25° C. to 260° C. at ΔT=10° C./minute with a nitrogen flow of 50 cc/minute. High volume (100 µL) aluminum pans were used. A small hole was punched in the top before crimping. Scans for the analysis of the curing performance of formulations after oven curing experiments were run from 25° C. to 400° C. at ΔT=10° C./minute with a nitrogen flow of 50 cc/minute using non-hermetic aluminum pans. After the initial scan, the samples were cooled back to room temperature, then the scans were re-run to obtain $T_g$ data.

Example 1

Syntheses of FUR/monoZE and FUR/ZE

FUR/monoZE and FUR/ZE: AEPD® (14.06 g, 0.10 moles), furfural (19.22 g, 0.20 moles), and 15 mL of methanol were charged to a 500 mL jacketed resin kettle. The clear amber solution was stirred under a nitrogen blanket at 65° C. for 48 hours. The solvent was removed by rotary evaporation to yield 27.3 g of nearly black oil. GC analysis showed that the product consisted of a mixture of the mono- and bis-oxazolidines in approximately a 1:2 ratio. GC/MS analysis confirmed the identities of the products.

Example 2

Synthesis of IPA Oxazine

IPA Oxazine: A 2-liter, 3-neck round bottom flask equipped with a nitrogen blanket, addition funnel, mechanical stirrer and thermocouple was charged with isopropylamine (425 mL, 5.0 mol). The addition funnel was charged with a pre-dissolved mixture of tris(hydroxymethyl)nitromethane (TN®)(377.75 g, 2.5 mol) in 37% aqueous formaldehyde (202.9 g, 2.5 mol) and the reactor contents cooled to 15 C with a cold water bath. The TN/formaldehyde solution was added dropwise to the isopropylamine over a period of 1.5 hours while maintaining an internal reaction temperature of 15-19° C. After the addition was complete, the cooling bath was removed. The mixture changed from a clear solution to a water/oil emulsion and slowly warmed to 34° C. over 40 minutes. A heating mantle was then used to warm the mixture to 70° C. for 5 hours. The reaction mass was then allowed to cool back to room temperature overnight. The reaction product had partially solidified to a yellow paste. Hexane (750 mL) was then added and the water was azeotropically removed. As the last of the water was removed, a white solid precipitated. The slurry was placed in the freezer overnight to complete crystallization. The white, crystalline hexahydropyrimidine product was recovered via filtration, 245 g, 39.9% of theory. The hexane layer was concentrated on a rotary evaporation to yield the oxazine (IPA-OZ) as a yellow oil (approximately 370 g, 60% of theory). Note: Over a period of weeks, the oxazine will slowly convert to the hexahydropyrimidine as evidenced by its crystallization from the oil.

Example 3

Synthesis of NTA

NTA: This compound was prepared according to the method described in U.S. Pat. No. 4,267,322.

Example 4

Synthesis of ATA

ATA: A 2-liter stainless steel autoclave was charged with 40 g (0.22 moles) of NTA, 25 g of Raney Nickel catalyst (50 wt. % slurry in water), and with 1-liter of methanol. The mixture was stirred at 800 rpm, and was hydrogenated at 750 psig. The initial reaction temperature was 60° C., and was gradually increased to >100° C. as hydrogen uptake decreased. The reduction was monitored by GC analysis, and was complete in about 4 hours. The reaction mixture was filtered, and the catalyst was washed with about 100 g of methanol. The combined filtrate and washings were solvent-stripped by rotary evaporation. The wet solids that were isolated were dried by azeotrope with toluene under reduced pressure. The yield of ATA as a crystalline solid product was 29.0 g (87%). The identity of the compound was confirmed by GC/MS analysis.

Example 5

Synthesis of HEX-BNM

HEX-BNM: Hexa (1.00 g, 7.1 millimoles) and BNM (1.00 g, 7.1 millimoles) were dissolved in 15 mL of methylene chloride in a small flask under a blanket of nitrogen. After stirring at room temperature overnight, the initially clear, colorless solution had become an orange slurry. The solids were isolated by filtration and were washed on the filter with fresh methylene chloride. The yield of light orange-yellow HEX-BNM was 0.8 g (40%). MP=188-192° C. IR analysis showed a strong ammonium N—H$^+$ band at 3429 cm$^{-1}$ but no —NO$_2$ bands. This indicated that the product was the nitronate salt rather than the N-alkylated bromide salt.

Example 6

Synthesis of HEX-BzCl

HEX-BzCl: Hexa (1.40 g, 0.10 mole) and benzyl chloride (1.26 g, 0.10 mole) were dissolved in 25 g of chloroform in a small flask equipped with a reflux condenser. The clear, colorless solution was refluxed under a nitrogen blanket for 4 hours. The white solid that formed was collected by filtration, and was washed on the filter with fresh chloroform. The yield of HEX-BzCl was 2.2 g (82%). MP=175-178° C. IR analysis confirmed that the product was the N-alkylated chloride salt.

Example 7

Synthesis of Glutaraldehyde-bis-IPHA nitrone (Glut-IPHA)

Glut-IPHA: A 500 mL flask was charged with 100.14 g of 15 wt. % aqueous IPHA solution (0.20 moles) and with 20.02 g of 50 wt. % aqueous glutaraldehyde solution (0.10 moles). The solution turned yellow, but remained clear. The solution was stirred at room temperature for several days, then the bulk of the water was removed by rotary evaporation at a bath temperature of 35° C. The remaining water was removed from the isolated yellow paste by azeotrope with toluene under reduced pressure. The yellow amorphous solid product that resulted was finally dried under vacuum at room temperature. The yield of Glut-IPHA was 21.4 g (100%). MP=44-46° C.

Example 8

Synthesis of Glyoxal-based Bis-nitrones

Glyoxal-based Bis-nitrones: Glyoxal-based bis-nitrones from IPHA, PHA, and EHA were all prepared by the general procedure described below:
A 50 mL flask was charged with 25.05 g of 15 wt. % aqueous IPHA solution (0.05 moles) and with 3.64 g of 40 wt. % aqueous glyoxal solution (0.025 moles). The mixture was stirred at room temperature under a nitrogen blanket. After 3 hours, the white solid product was collected by filtration. The product was washed on the filter with water, then it was dried under vacuum at 80° C. for 2 hours. The yield of glyoxal-bis-IPHA nitrone (Gly-IPHA) was 3.49 g (81%). MP=197-198° C. (dec.).

Both the PHA and EHA bis-nitrones were significantly soluble in water, resulting in lower yields. No attempts were made to increase product yields by concentration of the reaction mixtures or filtrates.

Example 9

Synthesis of Terephthalaldehyde-bis-IPHA nitrone

Tere-IPHA: a 250 mL flask was charged with 26.89 g (0.20 moles) of terephthalaldehyde, 37.56 g (0.50 moles) of solid IPHA, and with 45 g of methanol. The mixture was stirred under a nitrogen blanket at room temperature. After initially exhibiting an endotherm as the reactants dissolved to a clear solution, the reaction mixture began an exotherm to ca. 60° C. During the course of the exotherm, solids began to separate from the reaction solution. The reaction mixture was then stirred at room temperature overnight. The white solid product was isolated from the mixture by filtration. The product was washed on the filter with a small portion of isopropanol, then it was air-dried. The yield of bis-nitrone was 38.36 g (77%). MP=223-225° C. GC/MS and NMR analyses confirmed the product structure.

Example 10

Synthesis of Furfural-IPHA nitrone

Fur-IPHA: A 250 mL flask was charged with 9.61 g (0.10 moles) of 2-furfural, 11.27 g (0.15 moles) of solid IPHA, and with 50 g of methanol. The mixture was stirred under a nitrogen blanket at room temperature to give a clear, amber solution. The reaction mixture was stirred at room temperature overnight. The solvent was removed by rotary evaporation to give an amber oil that crystallized on standing. The crude product was recrystallized from hexane to give 12.13 g (79%) of Fur-IPHA as a crystalline, tan solid. MP=54-56° C. Product structure was confirmed by GC/MS, IR, and NMR analyses.

Example 11

Synthesis of N-(2-Nitroisobutyl)aniline (NMP-An)

NMP-An: A 100 mL flask was charged with 11.91 g (0.10 moles) of NMP, 9.31 g (0.10 moles) of aniline, with 5 mL of water, and with 1 mL of 40 wt. % aqueous tetrabutylammonium hydroxide solution. The 2-phase reaction mixture was stirred under a nitrogen blanket at 55° C. for 37 hours. After cooling to room temperature, the yellow crystalline product that separated during the reaction period was collected by filtration, and was washed on the filter with water. The product was dried on the filter in air, and then in a vacuum oven at 40° C. to give 18.18 g of yellow crystalline NMP-An (94%). MP=60-62° C. Product structure was confirmed by GC/MS analysis.

Example 12

In Situ Synthesis of NEPD®/NB® Blend and of NEPD®/NB®/TN® Blend

NEPD®/NB® Blend: A 2-liter, 3-neck round bottom flask equipped with a $N_2$ blanket, dropping funnel, magnetic stirrer, heating mantle and external cooling bath was charged with methyl Formcel (327.3 g, 6.0 mol, 55% solution of formaldehyde in 35% methanol) and triethylamine (2.0 mL, 1.45 g, 0.014 mol). The dropping funnel was charged with 1-nitropropane (356.4 g, 4 mol) and the heating mantle used to warm the reactor contents to 40° C. The mantle was removed and rapid dropwise addition of 1-nitropropane initiated. After several minutes, the heat of reaction began to warm the reaction mass; external cooling was used to maintain the reaction temperature between approximately 39-41° C. Near the end of the 1-NP addition, the reaction temperature began to fall as nearly all the formaldehyde had been consumed; the 1-NP addition rate was increased substantially for the last 75 mL of the addition. The 1-nitropropane addition took approximately 1.5 hours to complete. After stirring at room temperature overnight, the yellow solution was concentrated on a rotary evaporation at 55° C./10 torr ultimate vacuum. Approximately 540 g of a low viscosity, oily yellow product was obtained. A GC area % analysis indicated a 60/40 mixture of NEPD® and NB®.

NEPD®/NB®/TN® Physical Blend: A glass bottle was charged with 9.9 g of the NEPD®/NB® mixture prepared in the previous example. TN® crystals, 9.9 g were added and the bottle placed in a 40° C. oven for several hours to effect dissolution. The TN® was fully soluble at 40° C., but crystallized upon cooling to room temperature. A second 9.9 g aliquot of NEPD®/NB® mixture was added to the bottle and again dissolution effected via heating at 40° C. This product remains an oil for several hours, but will solidify to a paste overnight. The molten form of this product was used in formulation studies.

NEPD®/NB®/TN® Blend: A 2-liter, 3-neck round bottom flask equipped with a nitrogen blanket, dropping funnel, magnetic stirrer, heating mantle and external cooling bath was charged with methyl Formcel (319.1 g, 5.85 mol, 55% solution of formaldehyde in 35% methanol) and triethylamine (2.0 mL, 1,45 g, 0.014 mol). The dropping funnel was charged with a mixture of 1-nitropropane (200.3 g, 2.25 mol) and nitromethane (45.8 g, 0.75 mol) and the heating mantle used to warm the reactor contents to 40° C. The mantle was removed and rapid dropwise addition of the 1-NP/NM® mixture initiated. After several minutes, the heat of reaction began to warm the reaction mass; external cooling was used to maintain the reaction temperature between approximately 39-41° C. Near the end of the nitroalkane addition, the reaction temperature began to fall as nearly all the formaldehyde had been consumed; the nitroalkane addition rate was increased substantially for the last 75 mL of the addition. The nitroalkane addition took approximately 50 minutes to complete. The yellow solution was allowed to stir at room temperature for several hours before transferring to a glass bottle for storage.

Example 13

Synthesis of 1,3-Diphenylimidazolidine (DPI)

A 50 mL 3-neck flask was equipped with a magnetic stirrer, a heating mantle with power supply, and a reflux condenser. The flask was charged with 5.31 g (0.025 moles) of dianilinoethane (DAE) and with 15 g of methanol. The mixture was warmed and stirred under a nitrogen blanket until a clear, dark brown solution was obtained. The solution was cooled to room temperature, then 1.36 g of Formcel® (0.025 moles of formaldehyde) were added in one portion. The mixture was heated at reflux for 18 hours; solids began to separate after the first 2 hours. The solids were collected by filtration and were washed on the filter with a small volume of methanol. After drying, the yield of DPI was 4.13 g (74%) as a beige solid. Product MP=123-125° C. Product structure was confirmed by IR, NMR, and GC/MS analyses.

Example 14

Synthesis of 1-Imidazolidineethanol (ImE)

ImE: A 500 mL 3-neck flask was equipped with a magnetic stirrer, a heating mantle with power supply, a reflux condenser and an addition funnel. The flask was charged with 104.17 g (1.00 moles) of aminoethylethanolamine (AEEA) and with 50 g of methanol. The addition funnel was charged with 59.02 g of Formcel® (1.08 moles of formaldehyde). The amine solution was warmed to 40° C. while stirring under a nitrogen blanket. The Formcel® was added dropwise over 1 hour. The reaction mixture exhibited an exotherm to ca. 70° C. during the addition, and then cooled back to ca. 50° C. After completing the Formcel® addition, the reaction mixture was refluxed for 3 hour, and then it was allowed to cool to room temperature.

The solvent was removed from the reaction mixture by rotary evaporation. Toluene was added to the initial product to remove water by azeotrope. The yield of ImE was 119.67 g (103%) as a clear yellow oil. GC analysis showed the presence of some toluene and some unreacted AEEA. Product structure was confirmed by IR, NMR, and GC/MS analyses.

Example 15

Synthesis of 1-Oxo-3,5-diaza[1.2.4]bicyclononane (ODB)

ODB A 3-L 3-neck flask was charged with 849.13 g (7.31 moles) of ImE and 350 mL of methanol. The flask was equipped with a magnetic stirrer, a reflux condenser, a heating mantle with power source, and an addition funnel. The addition funnel was charged with 398.86 g of Formcel® (7.31 moles of formaldehyde). The ImE solution was stirred at reflux under a nitrogen blanket, and the Formcel® was added over a period of 5 hours. Reflux was continued for 5 hours after completing the Formcel® addition. The bulk of the solvent was removed from the reaction mixture by rotary evaporation. Toluene was added to remove water as an azeotrope. The yield of ODB was 928.20 g (99%) as a viscous, red-orange oil. IR, NMR, and GC/MS analyses showed that the bulk of the product could be attributed to the ODB structure. Several other components were observed in lesser amounts. No ImE remained.

Example 16

Synthesis of 3-Oxazolidineethanol (3OE)

3OE A 1-L 3-neck flask was equipped with a magnetic stirrer, a reflux condenser, an addition funnel, and a heating mantle with power supply. The flask was charged with 262.82 g (2.5 moles) of diethanolamine (DEA) and with 125 g of methanol. The addition funnel was charged with 136.48 g of Formcel® (2.5 moles of formaldehyde). The solution was stirred at reflux under a nitrogen blanket, and the Formcel® was added over a period of 3 hours. Reflux was continued for 2 hours after the addition was completed. The bulk of the solvent was removed from the reaction mixture by rotary evaporation. Toluene was added to remove water as an azeotrope. The yield of 3OE was 291.03 g (99%) as a yellow oil. Product structure was confirmed by NMR and GC/MS analyses.

Example 17

Synthesis of 3-Phenyloxazolidine (3POX)

3POX A 500 mL 3-neck flask was equipped with a magnetic stirrer, a reflux condenser, an addition funnel, and a heating mantle with power supply. The flask was charged with 137.17 g (1.0 mole) of N-phenylethanolamine (NPEA) and 25 g of methanol. The addition funnel was charged with 55.20 g of Formcel® (1.01 moles of formaldehyde). The NPEA solution was stirred at room temperature under a blanket of nitrogen, and the Formcel® was added over a period of 1.25 hours. After completing the addition, the reaction mixture was stirred at room temperature overnight. The bulk of the solvent was removed from the reaction mixture by rotary evaporation. Toluene was added to remove water as an azeotrope. The yield of 3POX was 144.54 g (97%) as a clear, amber oil. Product structure was confirmed by NMR and GC/MS analyses.

Example 18

Synthesis of 3,3'-(2-Methyl-2-nitro-1,3-propanediyl) bis[4,4-dimethyloxazolidine](NMPD-bis-1135) and 4,4-Dimethyl-1-oxa-3-[N-(2-hydroxymethyl-2-nitropropyl)]azacyclopentane (NMPD-1135)

NMPD-bis-1135 and NMPD-1135 A 25 mL 3-neck flask was equipped with a magnetic stirrer, a reflux condenser, an addition funnel, and a heating mantle with temperature controller and thermocouple. The flask was charged with 8.17 g (0.10 mole) of 37 wt. % aqueous formaldehyde and with 3.81 g (0.05 moles) of nitroethane. The addition funnel was charged with 10.1 g (0.10 mole) of CS-1135. The CS-1135 was added to the flask over a period of ca. 15 minutes. The temperature of the reaction mixture did not exceed 35° C. during the addition. After completing the addition, the mixture was heated under a nitrogen blanket at 60-65° C. for 3 hours. The reaction mixture was then allowed to cool back to room temperature. Upon cooling, the mixture separated into layers, one of which solidified to a white crystalline solid. The solid product was isolated by filtration, and was recrystallized from ca. 25 mL of 1:1, volume water—isopropanol. GC analyses showed the product to consist of >70% of NMPD-bis-1135. GC/MS analyses confirmed that the bulk of the product was NMPD-1135.

Example 19

Synthesis of Oxazolidine (OX). 3,3'-methylenebisoxazolidine (bis-OX), and 1,3,5-tris(2-hydroxyethyl)hexahydro-1,3,5-triazine (TRI)

OX, bis-OX, and TRI A 100 mL 3-neck flask was equipped with a magnetic stirrer, a reflux condenser, an addition funnel, and a heating mantle with temperature controller and thermocouple. The flask was charged with 30.57 g (0.50 moles) of monoethanolamine (MEA). The funnel was charged with 27.31 g of Formcel® (0.52 moles of formaldehyde). The MEA was stirred at room temperature under a nitrogen blanket, and the Formcel® was added over a period of 1 hour. The reaction flask was cooled in a water bath during the addition to keep the reaction temperature at <35° C. The reaction mixture was then stirred at room temperature overnight. The product was subjected to distillation at atmospheric pressure. Several grams of water were collected at head temperatures of up to 100° C., followed by ca. 4 g of colorless distillate collected at 105-108° C. (designate as "fraction 2"). Distillation then stopped. The viscous, clear amber oil (designate as "product") in the distilling flask did not distil over even at a pot temperature of 150° C. at a pressure of 5 torr. IR, NMR, and GC/MS analyses indicated that "fraction 2" was OX, and that the "product" consisted primarily of bis-OX. Some OX was also detected, and the presence of TRI could not entirely be ruled out.

Example 20

Synthesis of 1-aza-3,7-dioxabicyclo[3.3.0]octane (SER-OX)

SER-OX Charged solid serinol (18.2 g, 0.2 mol) to a 3-neck flask equipped with a magnetic stirrer, heating mantle, dropping funnel and N2 blanket. The flask was warmed to 55° C. where the serinol fully melted. Formcel® (23.4 g, 0.43 mol) was charged to the addition funnel and a dropwise addition started. The Formcel® was added over 15 minutes while maintaining an internal reaction temperature of 55-62° C. The mixture was held at 60° C. for 2 hours after the addition was completed. The flask was fitted with a vacuum distillation head and the clear, nearly colorless solution was distilled. The fraction boiling between 62-66° C./10 torr was collected (21 g, 91.1% yield). The clear, colorless fluid product was shown to be >99% pure by GC, and the identity confirmed by GC/MS, NMR and FTIR.

Example 21

Synthesis of 4-Ethyloxazolidine (AB-OX)

AB-OX Prepared using the procedure described for Serinol-Ox. A 10% molar excess of Formcel® was used relative to 2-aminobutanol. The crude reaction mixture was distilled under vacuum; the fraction boiling between 45-52° C./15 torr was collected (45 g, 44.5% yield). The clear, colorless fluid product was shown to be >96% pure by GC, and the identity confirmed by GC/MS, NMR and FTIR.

Example 22

Comparative DSC Data Survey—New Hardeners

In order to demonstrate the utility of the hardeners disclosed in this invention, a series of formulations were prepared using commercially available PF novolac resins. In order to facilitate mixing of components, the resins in this study were used as 85 wt. % solutions in ethanol. Any variations observed in the curing behavior of these formulations were attributed to the hardener/catalyst being evaluated. Hexa was used as the baseline for comparison since it is the hardener used most extensively in the industry.

The formulations were evaluated using a differential scanning calorimeter (DSC; TA Instruments Model Q100) to observe curing onset and peak temperatures and heats of curing for the curing events taking place. The DSC scans were run at $\Delta T=10°$ C./minute from $25°$ C. to $260°$ C. under a nitrogen flow of 50 cc/minute. The data obtained in this study are summarized in the Table below.

The classes of hardeners evaluated herein, with specific examples of each, include the following:

Oxazolidines (OX) and Nitrooxazolidines (NIT-OX):

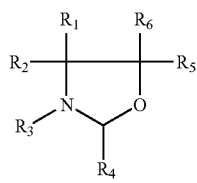

$R_1$, $R_2$, $R_3$, $R_4$, $R_5$, $R_6$=may be the same or different, selected from H, $C_1$-$C_{12}$ linear or branched alkyl or alkenyl, cycloalkyl, phenyl, substituted aryl, heterocyclic, hydroxymethyl, hydroxy-terminated polyoxyalkylene, halogen,

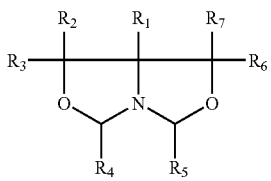

$R_1$, $R_2$, $R_3$, $R_4$, $R_5$, $R_6$, $R_7$=may be the same or different, selected from H, $C_1$-$C_{12}$ linear or branched alkyl or alkenyl, cycloalkyl, phenyl, substituted aryl, heterocyclic, hydroxymethyl, hydroxy-terminates polyoxyalkylene, halogen

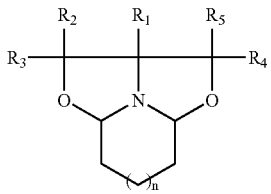

n=integer from 1 to 6 $R_1$, $R_2$, $R_3$, $R_4$, $R_5$=may be the same or different, selected from H, $C_1$-$C_{12}$ linear or branched alkyl or alkenyl, cycloalkyl, phenyl, substituted aryl, heterocyclic, hydroxy-terminated polyoxyalkylene, halogen

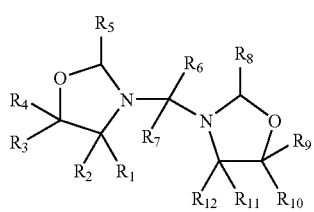

$R_1$ to $R_{12}$=same or different, selected from H, $C_1$-$C_{12}$ linear or branched alkyl or alkenyl, cycloalkyl, phenyl, substituted aryl, heterocyclic, hydroxymethyl, hydroxy-terminated polyoxyalkylene, hydroxymethyl, halogen

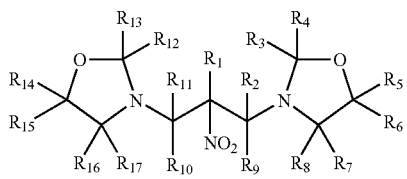

$R_1$ to-$R_{17}$=same or different, selected from H, $C_1$-$C_{12}$ linear or branched alkyl or alkenyl, cycloalkyl, phenyl, substituted aryl, heterocyclic, hydroxymethyl, hydroxy-terminated polyoxyalkylene, halogen

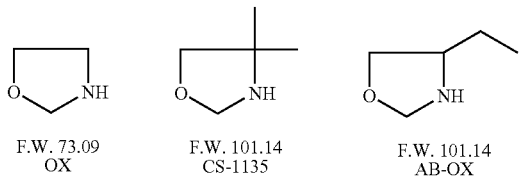

F.W. 73.09 OX
F.W. 101.14 CS-1135
F.W. 101.14 AB-OX

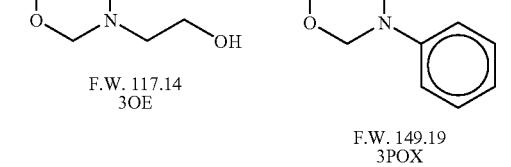

F.W. 117.14 3OE
F.W. 149.19 3POX

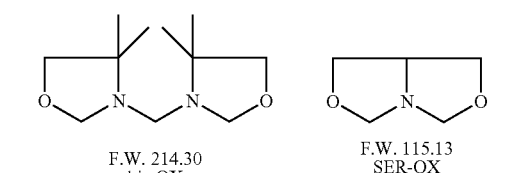

F.W. 214.30 bis-OX
F.W. 115.13 SER-OX

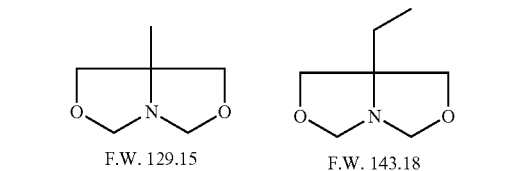

F.W. 129.15 CS-1991
F.W. 143.18 ZE

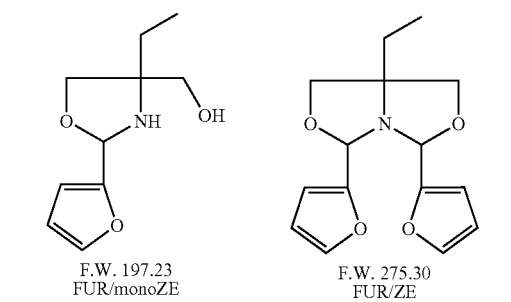

F.W. 197.23 FUR/monoZE
F.W. 275.30 FUR/ZE

-continued

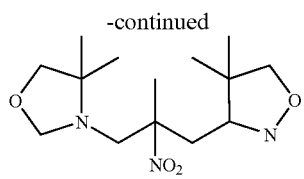

F.W. 301.38
NMPD-bis-1135

Nitroalcohols (NA), Nitroacetals (NAc)

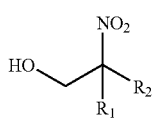

$R_1$, $R_2$=may be the same or different, selected from H, $C_1$-$C_{12}$ linear or branched alkyl or alkenyl, cycloalkyl, phenyl, substituted aryl, heterocyclic, hydroxy-terminated polyoxyalkylene, halogen

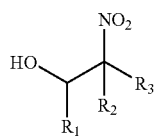 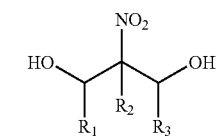

$R_1$, $R_2$, $R_3$=may be the same or different, selected from H, $C_1$-$C_{12}$ linear or branched alkyl or alkenyl, cycloalkyl, phenyl, substituted aryl, hydroxymethyl, heterocyclic, hydroxymethyl, hydroxy-terminated polyoxyalkylene, halogen

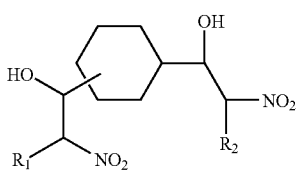

1,2-, 1,3-, and 1,4-isomers $R_1$, $R_2$=may be the same or different, selected from H, $C_1$-$C_{12}$ linear or branched alkyl or alkenyl, cycloalkyl, phenyl, substituted aryl, heterocyclic, hydroxymethyl, hydroxy-terminated polyoxyalkylene, halogen

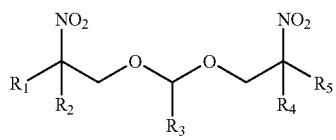

$R_1$, $R_2$, $R_3$, $R_4$, $R_5$=may be the same or different, selected from H, $C_1$-$C_{12}$ linear or branched alkyl or alkenyl, cycloalkyl, phenyl, substituted aryl, heterocyclic, hydroxymethyl, hydroxyl-terminated polyoxyalkylene, halogen

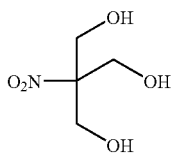

F.W. 151.11
TN

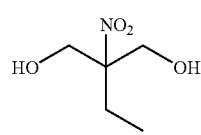

F.W. 149.14
NEPD

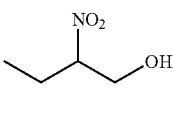

F.W. 119.12
NB

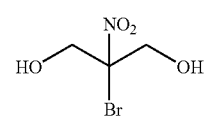

F.W. 199.98
BRONOPOL

Nitrones (NIT)

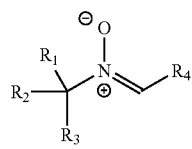

$R_1$, $R_2$, $R_3$, $R_4$=may be the same or different, selected from H, $C_1$-$C_{12}$ linear or branched alkyl or alkenyl, cycloalkyl, phenyl, substituted aryl, heterocyclic, halogen

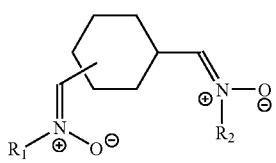

1,2-, 1,3-, and 1,4-isomers $R_1$, $R_2$=may be the same or different, selected from H, $C_1$-$C_{12}$ alkyl or alkenyl, cycloalkyl, phenyl, substituted aryl, heterocyclic, halogen

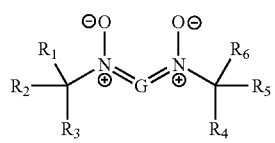

G is chosen from linear or branched alkyl or alkenyl containing 2 to 24 carbons; cycloalkyl or cycloalkenyl containing 3 to 24 carbons; phenyl; substituted aryl; heterocyclic; polyoxyalkylene $R_1$ to $R_6$=may be the same or different, selected from H, linear or branched alkyl or alkenyl containing 2 to 24 carbons; cycloalkyl or cycloalkenyl containing 3 to 24 carbons; phenyl; substituted aryl; heterocyclic; hydroxymethyl; hydroxyethyl; hydroxypropyl; hydroxy-terminated polyoxyalkylene, halogen

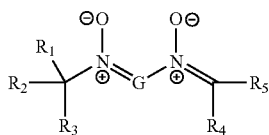

G is chosen from linear or branched alkyl or alkenyl containing 2 to 24 carbons; cycloalkyl or cycloalkenyl containing 3 to 24 carbons; phenyl; substituted aryl; heterocyclic; polyoxyalkylene $R_1$ to $R_5$=may be the same or different, selected from H, linear or branched alkyl or alkenyl containing 2 to 24 carbons; cycloalkyl or cycloalkenyl containing 3 to 24 carbons; phenyl; substituted aryl; heterocyclic; hydroxymethyl; hydroxyethyl; hydroxypropyl; hydroxy-terminated polyoxyalkylene, halogen

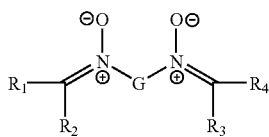

G is chosen from linear or branched alkyl or alkenyl containing 2 to 24 carbons; cycloalkyl or cycloalkenyl containing 3 to 24 carbons; phenyl; substituted aryl; heterocyclic; polyoxyalkylene $R_1$ to $R_4$=may be the same or different, selected from H, linear or branched alkyl or alkenyl containing 2 to 24 carbons; cycloalkyl or cycloalkenyl containing 3 to 24 carbons; phenyl; substituted aryl; heterocyclic; hydroxymethyl; hydroxyethyl; hydroxypropyl; hydroxy-terminated polyoxyalkylene, halogen

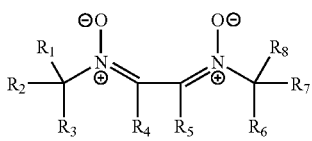

$R_1$ to $R_8$=may be the same or different, selected from H, linear or branched alkyl or alkenyl containing 2 to 24 carbons; cycloalkyl or cycloalkenyl containing 3 to 24 carbons; phenyl; substituted aryl; heterocyclic; hydroxymethyl; hydroxyethyl; hydroxypropyl; hydroxy-terminated polyoxyalkylene, halogen

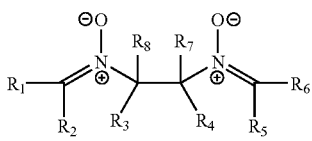

$R_1$ to $R_8$=may be the same or different, selected from H, linear or branched alkyl or alkenyl containing 2 to 24 carbons; cycloalkyl or cycloalkenyl containing 3 to 24 carbons; phenyl; substituted aryl; heterocyclic; hydroxymethyl; hydroxyethyl; hydroxypropyl; hydroxy-terminated polyoxyalkylene, halogen

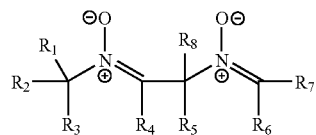

$R_1$ to $R_8$=may be the same or different, selected from H, linear or branched alkyl or alkenyl containing 2 to 24 carbons; cycloalkyl or cycloalkenyl containing 3 to 24 carbons; phenyl; substituted aryl; heterocyclic; hydroxymethyl; hydroxyethyl; hydroxypropyl; hydroxy-terminated polyoxyalkylene, halogen

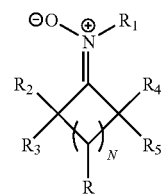

N=0 or integer from 1 to 12

R, $R_1$ to $R_5$=may be the same or different, selected from H, linear or branched alkyl or alkenyl containing 2 to 24 carbons; cycloalkyl or cycloalkenyl containing 3 to 24 carbons; phenyl; substituted aryl; heterocyclic; hydroxymethyl; hydroxyethyl; hydroxypropyl; hydroxy-terminated polyoxyalkylene, halogen

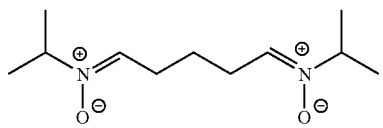

F.W. 214.30
Glut-IPHA

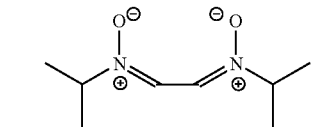

F.W. 172.22
Gly-IPHA

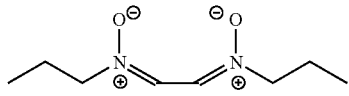

F.W. 172.22
Gly-PHA

-continued

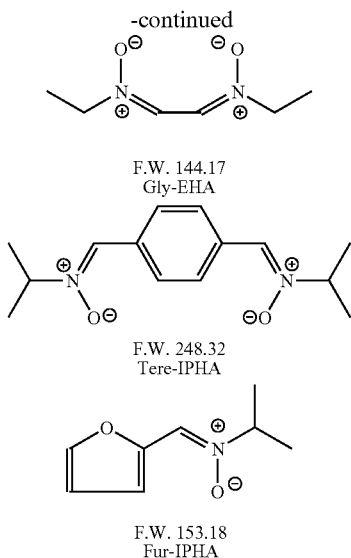

F.W. 144.17
Gly-EHA

F.W. 248.32
Tere-IPHA

F.W. 153.18
Fur-IPHA

Halonitroparaffins (HNP)

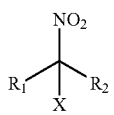

$R_1$, $R_2$=may be the same or different, selected from H, linear or branched alkyl or alkenyl containing 2 to 24 carbons; cycloalkyl or cycloalkenyl containing 3 to 24 carbons; phenyl; substituted aryl; heterocyclic; hydroxymethyl; hydroxyethyl; hydroxypropyl; hydroxy-terminated polyoxyalkylene, halogen X=Cl, Br, F, I

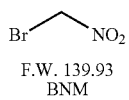

F.W. 139.93
BNM

Oxazines (OZ)

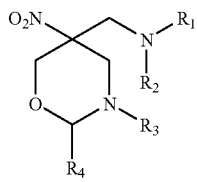

$R_1$, $R_2$, $R_3$=may be the same or different, selected from H, $C_1$-$C_{12}$ linear or branched alkyl or alkenyl, phenyl, substitutes aryl, heterocyclic;

$R_4$=selected from H, linear or branched alkyl or alkenyl containing 2 to 24 carbons; cycloalkyl or cycloalkenyl containing 3 to 24 carbons; phenyl; substituted aryl; heterocyclic; hydroxymethyl; hydroxyethyl; hydroxypropyl; hydroxy-terminated polyoxyalkylene, halogen

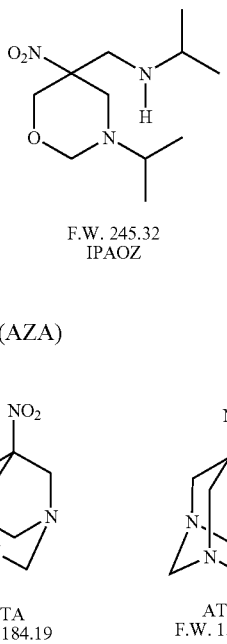

F.W. 245.32
IPAOZ

Azaadamantanes (AZA)

NTA
F.W. 184.19

ATA
F.W. 154.21

Hexamethylenetetramines Salts (HEX-S)

$R_1$=selected from H, methyl, linear or branched alkyl or alkenyl containing 2 to 24 carbons; cycloalkyl or cycloalkenyl containing 3 to 24 carbons; phenyl; substituted aryl; heterocyclic; hydroxymethyl; hydroxyethyl; hydroxypropyl; hydroxy-terminated polyoxyalkylene Y=Cl, Br, F, I, linear or branched or cyclic or aryl or substituted aryl or heterocyclic or hydroxyalkyl halonitroparaffin containing 2 to 24 carbons

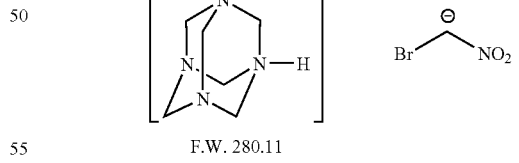

F.W. 280.11
Hex—BNM

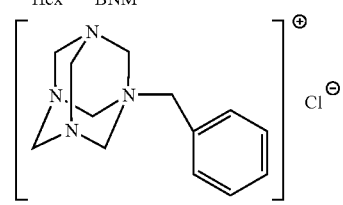

F.W. 266.76
Hex—BzCl

Nitroamines (NAm)

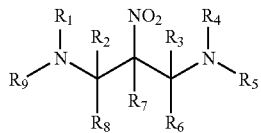

R₁ to R₉=maybe the same or different, selected from H, $C_1$-$C_{12}$ linear, branched, or cyclic alkyl or alkenyl, phenyl, substituted aryl, heterocyclic, hydroxymethyl, hydroxy-terminated polyoxyalkylene, or halogen

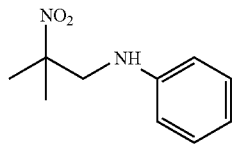

F.W. 194.23
NMP-An

Imidazolidines (ImA) and Nitroimidazolidines (NIT-ImA)

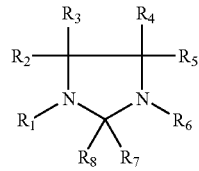

R₁ to R₈=may be the same or different, selected from H, $C_1$-$C_{12}$ linear or branched alkyl or alkenyl, cycloalkyl, phenyl, substituted aryl, heterocyclic, hydroxymethyl, hydroxy-terminated polyoxyalkylene, halogen,

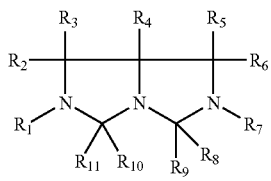

R₁ to R11=may be the same or different, selected from H, $C_1$-$C_{12}$ linear or branched alkyl or alkenyl, cycloalkyl, phenyl, substituted aryl, heterocyclic, hydroxymethyl, hydroxy-terminated polyoxyalkylene, halogen

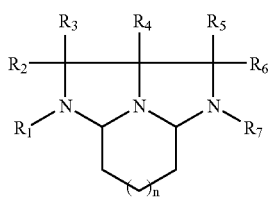

n=integer from 1 to 6

R₁ to R₇=may be the same or different, selected from H, $C_1$-$C_{12}$ linear or branched alkyl or alkenyl, cycloalkyl, phenyl, substituted aryl, heterocyclic, hydroxymethyl, hydroxy-terminated polyoxyalkylene, halogen

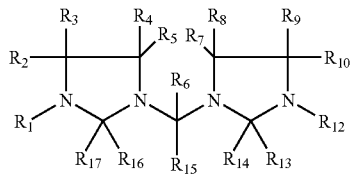

R₁ to R₁₇=same or different, selected from H, $C_1$-$C_{12}$ linear or branched alkyl or alkenyl, cycloalkyl, phenyl, substituted aryl, heterocyclic, hydroxymethyl, hydroxy-terminated polyoxyalkylene, halogen

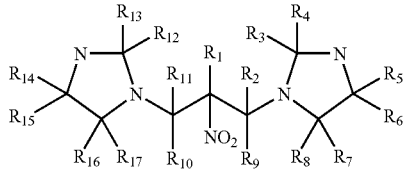

R₁ to R₁₇=same or different, selected from H, $C_1$-$C_{12}$ linear or branched alkyl or alkenyl, cycloalkyl, phenyl, substituted aryl, heterocyclic, hydroxymethyl, hydroxy-terminated polyoxyalkylene, halogen

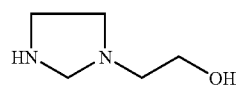

F.W. 116.16
ImE

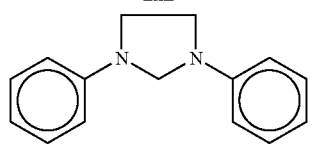

F.W. 224.30
DPI

Triazines (TRI)

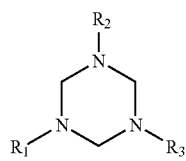

R₁ to R₃=same or different, selected from H, $C_1$-$C_{12}$ linear or branched alkyl or alkenyl, cycloalkyl, phenyl, substituted aryl, heterocyclic, hydroxymethyl, hydroxyethyl, hydroxy-terminated polyoxyalkylene

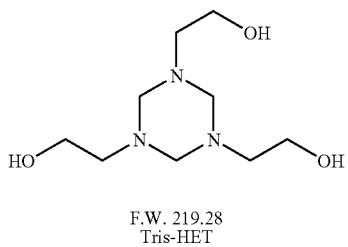

F.W. 219.28
Tris-HET

Imidazolidine-Oxazolidine Hybrids (ImA-OX)

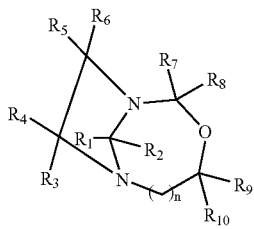

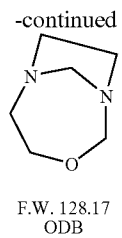

F.W. 128.17
ODB n=0 or an integer from 1 to 6

$R_1$ to $R_{10}$=same or different, selected from H, $C_1$-$C_{12}$ linear or branched alkyl or alkenyl, cycloalkyl, phenyl, substituted aryl, heterocyclic, Hydroxymethyl, hydroxyethyl, hydroxy-terminated polyoxyalkylene Novel Phenolic Resins
 Comparative DSC Survey
 TA Instruments Model Q 100 DSC
 Run Conditions: 10° C./minute from 25° C. to 260° C. with nitrogen at 50 cc/min. 85 wt. % commercial novolac resin in 15 wt. % ethanol

| CLASS: | |
|---|---|
| Am = amine | NAm = nitroamine |
| OX = oxazolidine | NIT = nitrone |
| HA = hydroxylamine | AZA = triazaadamantane |
| NA = nitroalcohol | Hex-S = hexamethylenetetramine salt |
| OZ = oxazine | ImA = imidazolidines |
| NIT-OX = nitrooxazolidines | ImA-OX = imidazolidine - oxazolidine hybrid |

| EXAMPLE NO. | RESIN FORMULATION | | | CURING EVENTS | |
|---|---|---|---|---|---|
| | HARDENER | PHR | CLASS | ONSET/PEAK, C. (HEAT, J/g) | ONSET/PEAK, C. (HEAT, J/g) |
| 22-1 | HEXA | 5.39 | Am-baseline | 140/153 (69) | 244/255 (72) |
| 22-2 | Hexa-BzCl | 10 | Hex-S | 142/157 (70) | |
| 22-3 | Hexa-BNM | 8.6 | Hex-S | 129/164 (72) | |
| 22-4 | NTA | 8.6 | AZA | 180/197 (173) | |
| 22-5 | NTA/IPHA | 8.6/5.0 | AZA-HA | 170/192 (245) | |
| 22-6 | | 8.6/2.5 | AZA-HA | 173/194 (133) | |
| 22-7 | | 8.6/1.0 | AZA-HA | 173/194 (155) | |
| 22-8 | ATA | 15 | AZA | 98/116 (17) | 171/214 (78) |
| 22-9 | | 8.6 | AZA | 105/117 (15) | 169/200 (77) |
| 22-10 | TN | 11.11 | NA | 198/208 (254) | |
| 22-12 | TN/DMTA | 9.0/1.0 | NA-Am | 171/191 (106) | |
| 22-13 | TN/Hexa | 9.0/1.0 | NA-Am | 147/182 (80) | ca. 210/ca. 230 (49) |
| 22-14 | NMPD | 15 | NA | 198/212 (83) | |
| 22-15 | NMPD/IPHA | 10.0/5.0 | NA-HA | 139/140 (3) | ca. 150/196 (103) |
| 22-16 | Bronopol | 20 | NA | 219/236 (302) | |
| 22-17 | Bronopol/IPHA | 15.0/5.0 | NA-HA | 163/190 37) | 212/241 (126) |
| 22-18 | Fur-IPHA | 15 | NIT | 194/229 (170) | |
| 22-19 | TN/Fur-IPHA | 12.8/5.0 | NIT-NA | 185/200 (177) | |
| 22-20 | | 5.0/5.0 | NIT-NA | 189/203 (122) | |
| 22-21 | Tere-IPHA | 15 | NIT | 218/243 (182) | |
| 22-22 | Glut-IPHA | 15 | NIT | 191/229 (160) | |
| 22-23 | | 7.5 | NIT | 196/229 (90) | |
| 22-24 | Gly-IPHA | 15 | NIT | 147/179 (255) | |
| 22-25 | TN/Gly-IPHA | 12.8/5.0 | NIT-NA | 164/179 (226) | |
| 22-26 | | 5.0/5.0 | NIT-NA | 157/179 (124) | |
| 22-27 | Gly-PHA | 15 | NIT | 130/165 (417) | |

-continued

| EXAMPLE NO. | RESIN FORMULATION | | | CURING EVENTS | |
|---|---|---|---|---|---|
| | HARDENER | PHR | CLASS | ONSET/PEAK, C. (HEAT, J/g) | ONSET/PEAK, C. (HEAT, J/g) |
| 22-28 | TN/Gly-PHA | 5.0/5.0 | NIT-NA | 153/174 (187) | |
| 22-29 | Gly-EHA | 15 | NIT | 128/161 (273) | |
| 22-30 | TN/Gly-EHA | 5.0/5.0 | NIT-NA | 142/169 (160) | |
| 22-31 | NMP-An | 15 | NAm | 158/181 (11) | |
| 22-32 | TN/NMP-An | 10.0/5.0 | NA-NAm | 183/197 (201) | |
| 22-33 | FUR/monoZE + FUR/ZE (1:2) | 25 | OX | ca. 88/ca. 100 | ca. 125/ca. 150 |
| 22-34 | IPA-OZ | 10 | OZ | 87/113 (73) | ca. 150/169 (61) |
| 22-35 | ZE | 33.3 | OX | 166/194 (264) | |
| 22-36 | | 44.2 | OX | 171/198 (244) | |
| 22-37 | bis-OX | 24.6 | OX | 69/>250 (ca. 250) | |
| 22-38 | SER-OX | 26.8 | OX | 154/177 (136) | |
| 22-39 | AB-OX | 47.1 | OX | 78/212 (71) | |
| 22-40 | CS-1991 | 30.1 | OX | 143/176 (233) | |
| 22-41 | 3OE | 54.5 | OX | 133, 245 (>100) | |
| 22-42 | 3POX | 69.4 | OX | 162 (193) | |
| 22-43 | NMPD-bis-1135 | 35.1 | NIT-OX | 131/158 (213) | |
| 22-44 | ImE | 54.1 | ImA | 141, 250 (>100) | |
| 22-45 | ODB | 29.8 | ImA-OX | 131, 209 (>100) | |
| 22-46 | ZE/KOH | 33.3/1.0 | OX | 129/176 (220) | |
| 22-47 | | 33.3/1.3 | OX | 121/176 (282) | |
| 22-48 | | 33.3/2.6 | OX | 118/170 (255) | |
| 22-49 | | 33.3/4.1 | OX | 121/162 (235) | |
| 22-50 | | 44.2/1.0 | OX | 131/183 (289) | |
| 22-51 | bis-OX/KOH | 24.6/1.2 | OX | 67/>250 (ca. 250) | |
| 22-52 | SER-OX/KOH | 26.8/1.2 | OX | 113/167 (188) | |
| 22-53 | AB-OX/KOH | 47.1/1.4 | OX | 88/207 (78) | |
| 22-54 | CS-1991/KOH | 30.1/1.2 | OX | 114/168 (238) | |
| 22-55 | 3OE/KOH | 54.5/1.5 | OX | 126, 240 (>100) | |
| 22-56 | 3POX/KOH | 69.4/1.7 | OX | 150 (160) | |
| 22-57 | ImE/KOH | 54.1/1.5 | ImA | 141, 240 (>100) | |
| 22-58 | ODB/KOH | 29.8/1.2 | ImA-OX | 133, 225 (>100) | |
| 22-59 | ZE/NaOPh | 33.3/6.1 | OX | 115/167 (288) | |
| 22-60 | ZE/Mg(OH)2 | 33.3/4.1 | OX | 178/205 (298) | |
| 22-61 | ZE/LiOH | 33.3/4.1 | OX | 122/169 (261) | |
| 22-62 | ZE/TMG | 33.3/3.3 | OX | 121/172 (225) | |
| 22-63 | ZE/TMAOH | 33.3/11.6 | OX | 127/179 (251) | |
| 22-64 | ODB/NaOPh | 29.8/6.1 | ImA-OX | 90/191 (80) | |
| 22-65 | DPI | 123 | ImA | 175/240 (>100) | |

The DSC data shown in the Table above displayed a wide variation in curing behavior. The results will be discussed as a function of hardener class.

Hexamethylenetetramine Salts (Hex-S)

Hexa is the hardener most commonly used with PF novolac resins. It exhibits two exotherms in the DSC. Its major drawback is that it begins to effect curing shortly after the formulation reaches a flowable melt state—i.e., it has a limited processing window.

U.S. Pat. No. 2,607,759 discloses the use of Hexa salts as latent catalysts for curing acid-catalyzed phenolic resins such as resoles and urea-formaldehyde resins. The hexa salts bind the acids and improve storage stability. The free acids needed to catalyze the resin curing are liberated at elevated temperatures.

JP 11343384 discloses the use of blends of Hexa and salts of Hexa and benzoic acids having ≧1 electron-withdrawing group as hardeners for curing novolac resins.

We now disclose and demonstrate the use of Hexa salts used alone—without the presence of free Hexa—as hardeners for novolac resins. The DSC of the Hex-BzCl formulation showed only one exothermic curing event instead of the two exhibited by Hexa alone (Ex. 22-2). Similarly, Hex-BNM showed a single curing exotherm, but at a slightly higher temperature (Ex. 22-3).

Azaadamantanes (AZA)

Although azaadamantanes (AZA) such as NTA and ATA have structural similarities to both Hexa and to nitroamines (NAm), there has been no disclosed use of them as hardeners for novolac resins. We now disclose and demonstrate that application.

NTA alone exhibits a single curing exotherm at a temperature between the two shown by Hexa. It thus offers a broader processing window (Ex. 22-4). Unlike nitroalcohols (NA) or alicyclic nitroamines (NAm), the curing onset and peak temperatures obtained for NTA were not affected by the incorporation of IPHA as an accelerator (Ex. 22-5 to 22-7).

The curing behavior of ATA was similar to that of Hexa in that two curing exotherms were observed (Ex. 22-8 and 22-9). However, the first curing event occurs at a lower temperature than that of Hexa, while the second occurs at a higher temperature.

Nitroalcohols (NA)

We have already demonstrated that nitroalcohols (NA) are effective hardeners for novolac resins. In addition to the tris-nitroalcohol TN, we have found that the bis-nitroalcohol NMPD®, and the halogenated bis-nitroalcohol Bronopol are also hardeners for novolac resins.

The curing onset and peak exotherm for NMPD® are essentially the same as observed for TN and the total heat of curing is lower. Given its structural similarity to TN and the fact that it can donate only two rather than three formaldehyde equivalents, these results are not surprising (Ex. 22-10 and 22-14).

The results obtained for Bronopol were somewhat unexpected. Rather than destabilizing the molecule and causing it to release formaldehyde at a lower temperature, the presence of the bromine actually increased the onset and peak curing temperatures (Ex. 22-16).

As we have demonstrated before, hydroxylamines (HA) act as a catalysts/accelerators with nitroalcohols. The incorporation of less than stoichiometric levels of IPHA into formulations of NMPD® or Bronopol significantly lowered both the cure onset and peak temperatures of the formulations (Ex. 22-15, 22-17).

In addition to hydroxylamines (HA), amines are known to destabilize nitroalcohols. The addition of less than stoichiometric amounts of Hexa or of DMTA (2-dimethylamino-2-hydroxymethyl-1,3-propanediol) to TN formulations resulted in significant lowering in both curing onset and peak temperatures (Ex. 22-12, 22-13).

Nitroamines (NAm)

We have demonstrated that nitroamines (NAm) resulting from the Mannich reaction of a nitroalcohol (NA) with a primary or secondary amine are effective hardeners for novolac resins.

A potential undesirable aspect of using NAm hardeners is that volatile amine by-products can be generated. We now demonstrate the use of NMP-An as a hardener in which the by-product is aniline, a reactive amine which is readily incorporated into the resin matrix. The NMP-An formulation exhibits curing onset and peak temperatures that are lower than those observed with NA hardeners (Ex. 22-31). The low heat of curing here is a function of NMP-An being only mono-functional. It is obvious that similar di- or tri-functional derivatives could be made from NMPD® or TN®.

Formulation of NMP-An with TN resulted in curing onset and peak temperatures that were higher than observed with NMP-An, but still lower than those for TN®(Ex. 22-32). The cure behavior is very similar to that observed with amine-catalyzed NA formulations. Thus, NAm hardeners provide both the benefits of methylene donation and of amine catalysis when formulated with other NA hardeners. An added benefit for aniline-based NAm hardeners is that the amine is non-volatile.

Oxazolidines (OX and Nitrooxazolidines (NIT-OX)

Oxazolidines (OX) are typically made by the reaction of amino alcohols with aldehydes. Most commercial oxazolidines are based on formaldehyde. We now disclose and demonstrate a furfural-based OX as a hardener for novolac resins.

The reaction of NEPD® with furfural goes not readily go to completion, although the bis-oxazolidine FUR/ZE is the predominant component. A formulation based on the mixed mono- and bis-oxazolidine reaction product showed two curing exotherms having onset and peak temperatures lower than those seen with Hexa (Ex. 22-33)

DSC data were generated for the series of mono-oxazolidines: AB-OX, 3OE, and 3POX (Ex. 22-39, 22-41, 22-42). All three of these oxazolidines were very reactive and began to cure within a short time after the formulations were prepared. Because of this, the DSC data do capture with reasonable accuracy the curing onset and peak temperatures, but do not accurately reflect the true total heats of curing.

DSC data were also obtained for a series of bis-oxazolidines: ZE, CS-1991, SER-OX, bis-OX, and NMPD-bis-1135 (Ex. 22-35 to 22-38, 22-40, 22-43). Of these, the first three represent a series of bicyclic bis-oxazolidines with different components at the bridgehead carbon. The presence of H or $CH_3$ appeared to have little effect on curing performance, but the $C_2H_5$ group seems to be large enough to cause an increase in curing onset and peak temperatures.

Another group of bis-oxazolidines is represented by bis-OX and NMPD-bis-1135. These are mono-oxazolidines separated by a spacer group in the same molecule. As noted in Example 19 above, bis-OX resulted from an attempt to synthesize the mono-oxazolidine, OX. Analyses showed that the product obtained consisted mainly of bis-OX, but the presence of OX and/or TRI could not be ruled out. DSC studies showed that the bis-OX had the lower curing onset temperature of the two but NMPD-bis-1135 had the lower curing peak temperature (Ex. 22-37 and 22-43).

Oxazines (OZ)

The synthesis of hexahydropyrimidines (PYRIM) from the reaction of nitroalcohols with amines and formaldehyde can also generate structurally similar oxazines (OZ) as by-products. We have previously demonstrated that PYRIM are effective hardeners for novolac resins. We would now like to disclose and demonstrate that OZ are effective hardeners as well.

The resin formulation based on IPA-OZ exhibited two curing exotherms (Ex. 22-34). The onset and peak temperatures for the first curing event are lower than the first curing event seen with Hexa, but the second curing event for IPA-OZ is comparable to the first event seen with Hexa.

Nitrones (NIT)

Nitrones (NIT) have exhibited a broader range of curing behavior of any class examined to date. This is a function of both the structures of the carbonyl component as well as the hydroxylamine component. This is demonstrated well with the bis-nitrones disclosed herein.

The observed high curing onset and peak temperatures were not surprising for the crystalline, 1,4-substituted structure of Tere-IPHA. However, the comparably high temperatures observed for Glut-IPHA—a low-melting compound containing a flexible, aliphatic chain—were surprising. The series of glyoxal-based bis-nitrones nicely demonstrates the influence of the structure of the hydroxylamine portion of the nitrone on curing properties. IPHA gives nitrones with significantly higher curing temperatures than structurally isomeric PHA, which gives only slightly higher curing temperatures than structurally similar EHA. It is interesting to observe that the heterocyclic mono-nitrone Fur-IPHA exhibits nearly identical curing behavior as the bis-nitrone Glut-IPHA (Ex. 22-18, 22-21 to 22-24, 22-27, 22-29).

An important finding of these studies was the observed synergy between nitrones (NIT) and nitroalcohols (NA) (Ex. 22-19, 22-20, 22-25, 22-26, 22-28, 22-30). In the case of blends of Fur-IPHA with TN, with the curing onset and peak temperatures of the nitrone being higher than those of the nitroalcohol, the curing temperatures of the blend were seen to be lower than those of the individual components. In blends that incorporate nitrone components having lower curing peak temperatures than the nitroalcohol components, the resulting curing temperatures are intermediate, but lie closer to the performance of the nitrone component. In effect, the nitrone component dramatically reduces the curing temperatures of the nitroalcohol, even when present in much less than stoichiometric levels.

Imidaxolidines (ImA) and Nitroimidazolidines (NIT-ImA)

Imidazolidines are structurally similar to oxazolidines, with the O being replaced by NH. They can be synthesized by the reaction of diamines with formaldehyde. Structural similarity implied similar reactivity. ImE was synthesized (Ex. 14) as a structural analog to oxazolidine 3OE. DSC studies showed that ImE was comparable in activity to 3OE, but had slightly higher curing onset and peak temperatures (Ex. 22-44 and 22-41). The curing profile of DPI was similar to that of ImE, but did not show the lower temperature exotherm (Ex. 65).

The range of available ImA structures is similar to those of OX. Activities are also expected to be similar.

Imidazolidine-Oxazolidine Hybrids (ImA-OX)

The synthesis of ImA (Ex. 14) led to the discovery of an interesting imidazolidine-oxazolidine (ImA-OX) hybrid by-product, ODB. It was demonstrated that ODB could be synthesized directly by adding additional formaldehyde to the intermediate ImE (Ex. 15).

On the basis of curing onset and peak temperatures, DSC analysis showed that ODB was more active than either 3OE or ImE (Ex. 22-45, 22-41, 22-44).

Catalysts/Accelerators

It has been shown above that curing reactivity of nitroalcohols (NA) could be increased by the addition of amines (Am), hydroxylamines (HA), nitroamines (Nam) or nitrones (NIT). DSC studies shown herein clearly demonstrate that both inorganic and organic bases act as effective accelerators/catalysts, lowering the curing onset and peak temperatures of oxazolidines, imidazolidines, and imidazolidine-oxazolidine hybrids (Ex. 22-46 to 22-64). For example, the addition of even 1 PHR of KOH to ZE decreased the curing onset and peak temperatures of the formulation by about 20° C. (Ex. 22-35 and 22-46). Higher KOH levels result in further onset and peak temperature decreases, but the effect is not linear (Ex. 22-46 to 22-50). In addition to KOH, LiOH was seen to be an accelerator/catalyst with ZE, but $Mg(OH)_2$ showed no enhancement. This is probably a result of its low solubility in the formulation. The organic bases, TMG, TMAOH, and NaOPh were also effective accelerators/catalysts with ZE.

The accelerator/catalytic effect of the inorganic and organic bases was likewise seen in the ImA and ImA-OX hardener classes as well.

Example 23

Comparative DSC Data Survey—New Hardeners/Alternative Solvents

The purpose of this Example is to demonstrate that, in addition to inert solvents such as the ethanol used in Example 22, reactive solvents—commonly referred to as reactive diluents—may also be utilized in these formulations. These reactive diluents may include, but in no way are limited to, phenol, the cresols, resorcinol, benzyl alcohol, and aniline and alkyl, hydroxyalkyl, or alkyl ether derivatives of these compounds; furfural, and furfuryl alcohol. In addition to their utility in modifying formulation viscosity to suit various processing requirements, reactive diluents are attractive in that they generate no potentially void-producing volatiles upon curing. Aniline and benzyl alcohol are the alternative diluents used in the examples in the table below. In each case, the resins are 85 wt. % in the indicated solvent.

Novel Phenolic Resins
   Comparative DSC Survey/Alternative solvents
   TA Instruments Model Q 100 DSC
   Run Conditions: 10° C./minute from 25° C. to 260° C. with nitrogen at 50 cc/min. 85 wt. % commercial novolac resin in 15 wt. % indicated solvent CLASS:   OX = oxazolidine
SOLVENT:   AN = aniline    BZ = benzyl alcohol

| EXAMPLE NO. | RESIN FORMULATION | | | | CURING EVENTS | |
|---|---|---|---|---|---|---|
| | HARDENER | PHR | CLASS | SOLVENT | ONSET/PEAK, C. (HEAT, J/g) | ONSET/PEAK, C. (HEAT, J/g) |
| 23-1 | ZE | 33.3 | OX | AN | 102/163 (214) | |
| 23-2 | ZE/KOH | 33.3/3.5 | OX | AN | 103/158 (203) | |
| 23-3 | ZE/NaOPh | 33.3/7.6 | OX | BZ | 117/170 (283) | |
| 23-4 | CS-1135 | 44.7 | OX | AN | 88/>250 (ca. 250) | |
| 23-5 | CS-1135/KOH | 44.7/3.5 | OX | AN | 135/>250 (ca. 250) | |

The above data clearly show formulation solvents other than ethanol can be used without compromising curing. The curing profile of ZE/NaOPh in benzyl alcohol is identical (within experimental error) to that seen in ethanol (Ex. 22-59 and 23-3).

Aniline can be seen to be useful for two reasons: it acts as a solvent, and it is reactive. Comparison of the curing profiles of ZE in ethanol and in aniline shows lower curing onset and peak temperatures in the aniline formulation (Ex. 22-35 and 23-1). Similar effects are to be expected with substituted anilines, phenol, and substituted phenols as solvents. Formulations based on these systems would be 100% reactive solids. They should exhibit faster curing than formulations based on water or other inert organic solvents and result in cured products having fewer voids and therefore having improved mechanical properties.

Example 24

Time/Temperature Cure Response for New Hardeners

It can be argues that, while DSC analyses indicate that the above formulations containing new hardeners exhibit exothermic events, they may represent hardener/resin decomposition rather than curing reactions. The definitive demonstration that these new hardeners do in fact effect resin curing was to conduct curing experiments.

The general procedure followed in these experiments is as follows: A test formulation is prepared. A small sample (0.5-1 gram) is placed between two sheets of ca. 4"×ca. 4"×0.003" aluminum foil, and this in turn is wrapped in a piece of 12"×10.75" thin foil. The resulting test parcel is quickly placed between two 12"×12"×0.5" stainless steel plates in an oven pre-heated to the desired test temperature. The test parcel is then removed after a specified time—usually between 15 and 60 seconds. After cooling, the parcel is opened, and the cured formulation is examined to determine if curing was achieved as evidenced by the presence of a solid film. The time/temperature cure response for each formulation could be determined by conducting a series of these experiments at varying temperatures for varying lengths of time. But this alone results in a range over which a solid cured film is produced. Further insight into the extent of curing was obtained by DSC analyses.

A sample of the solid film generated in a curing experiment is analyzed by DSC to determine the size of the residual exotherm (J/g). This is then compared to the total heat of curing in the as-formulated sample (Ex. 22) to obtain a percent of cure at each experimental time/temperature.

The hardeners and catalysts described in this invention can be applied in any application where phenolic resins are used, including but not limited to fiber reinforced composite applications such as pultrusion, filament winding, bulk molding compound (BMC), sheet molding compounds (SMC), vacuum assisted resin transfer, prepregs, adhesives, foundry materials, abrasives, friction materials, insulation, laminates, coatings, electronics, fire resistant, and flame-retardant end uses.

It should be readily apparent that the information generated in the time/temperature profiles is invaluable in determining processing conditions for a these applications. For example, the time required for a formulation to reach >85% cure at a given temperature can be translated into die temperature and residence time for pultrusion processes. They may similarly be used to determine mold temperatures and times for compression/injection molding or filament winding post-cure operations.

Novel Phenolic Resins

Time/Temperature Curing Profiles

TA Instruments Model Q 100 DSC

Run Conditions: 10° C./minute from 25° C. to 400° C. with nitrogen at 50 cc/min. 85 wt. % commercial novolac resin In 15 wt. % ethanol

| | % CURED | | | | | |
|---|---|---|---|---|---|---|
| | EXPERIMENT NO.: | | | | | |
| | 24-1 | 24-2 | 24-3 | 24-4 | 24-5 | 24-6 |
| CURE: TEMP., ° C./TIME, | FORMULATION (cf. Ex. 22): | | | | | |
| SEC. | 22-35 | 22-36 | 22-38 | 22-40 | 22-37 | 22-43 |
| 230/15 | (not cured) | (not cured) | 88.2 | 37.6 | 36.9 | 97.2 |
| 230/30 | 51.1 | 32.4 | 95.1 | 87.9 | 79.7 | 97.6 |
| 230/45 | 66.3 | | 98.2 | | | |
| 200/15 | | | 88.6 | | 28.6 | 95.1 |
| 200/30 | | | 89.0 | | 20.6 | 96.7 |
| 175/15 | | | 68.6 | | 7.4 | 94.8 |
| 175/30 | | | 83.0 | | 44.6 | 96.5 |
| 150/30 | | | 72.8 | | 11.0 | 89.8 |

| | % CURED | | | | |
|---|---|---|---|---|---|
| | EXPERIMENT NO.: | | | | |
| | 24-7 | 24-8 | 24-9 | 24-10 | 24-11 |
| | FORMULATION (cf. Ex. 22): | | | | |
| CURE: TEMP., ° C./TIME, SEC. | 22-39 | 22-41 | 22-42 | 22-44 | 22-45 |
| 230/15 | 99.2 | >53 | 83.3 | | |
| 230/30 | 98.6 | >66 | 92.8 | | |
| 200/15 | 70.8 | | | >57 | >49 |
| 200/30 | 82.0 | >87 | | >47 | >42 |
| 175/15 | cured | | | >26 | >66 |
| 175/30 | 68.2 | >65 | | >73 | >28 |
| 150/30 | cured | | | >43 | >17 |

| | % CURED | | | | | | | | |
|---|---|---|---|---|---|---|---|---|---|
| | EXPERIMENT NO.: | | | | | | | | |
| | 24-12 | 24-13 | 24-14 | 24-15 | 24-16 | 24-17 | 24-18 | 24-19 | 24-20 |
| CURE: TEMP., ° C./ | FORMULATION (cf. Ex. 22): | | | | | | | | |
| TIME, SEC. | 22-47 | 22-51 | 22-52 | 22-53 | 22-54 | 22-55 | 22-56 | 22-57 | 22-58 |
| 230/15 | 87.7 | | | | 84.7 | >62 | 77.9 | >60 | >53 |
| 230/30 | | | | | | >84 | 76.8 | >91 | >71 |
| 200/15 | | | | | 52.1 | >68 | 85.6 | >42 | >4 |

-continued

| TEMP., °C./TIME, SEC. | 24-21 22-46 | 24-22 22-48 | 24-23 22-49 | 24-24 22-50 | 24-25 22-59 | 24-26 FORMULATION (cf. Ex. 22): 22-60 | 24-27 22-61 | 24-28 22-62 | 24-29 22-63 | 24-30 22-64 |
|---|---|---|---|---|---|---|---|---|---|---|
| 200/30 | | | | | 56.0 | >67 | 66.1 | >74 | >40 | |
| 175/15 | | | | | | >32 | 40.4 | >1 | >1 | |
| 175/30 | | | | | 44.1 | >67 | 51.4 | >20 | >19 | |
| 150/15 | | | 63.7 | 54.0 | 58.1 | >66 | 40.4 | >39 | >33 | |
| 150/30 | | | 82.6 | 37.8 | 49.6 | 24.4 | >65 | 67.3 | >43 | >46 |
| 125/15 | | | 82.4 | 48.0 | | | | | | |
| 125/30 | | | cured | cured | | | | | | |

% CURED

| CURE: TEMP., °C./TIME, SEC. | 24-21 22-46 | 24-22 22-48 | 24-23 22-49 | 24-24 22-50 | 24-25 22-59 | EXPERIMENT NO.: 24-26 FORMULATION (cf. Ex. 22): 22-60 | 24-27 22-61 | 24-28 22-62 | 24-29 22-63 | 24-30 22-64 |
|---|---|---|---|---|---|---|---|---|---|---|
| 230/15 | 46.6 | 82.7 | 86.9 | 57.8 | 96.5 | | | | | 67.3 |
| 230/30 | 90.3 | | | 74.7 | 98.9 | | | | | 80.4 |
| 200/15 | | | | | 70 | (not cured) | | 16.0 | 43.4 | 35.9 |
| 200/30 | | | | | 93.4 | (not cured) | 40.2 | 34.2 | 65.3 | 55.8 |
| 200/45 | | | | | | | 93.6 | | 80.5 | |
| 175/15 | | | | | 37.1 | | | | | 9.9 |
| 175/30 | | | | | 46.9 | | | | | 39.8 |
| 150/15 | | | | | | | | | | |
| 150/30 | | | | | 30.9 | | | | | 24.9 |
| 125/15 | | | | | | | | | | 2 |
| 125/30 | | | | | | | | | | <1 |

What is claimed is:

1. A curable phenolic resin comprising:
   a. a novalac resin prepared from a phenolic compound and an aldehyde, wherein the phenolic compound is selected from the group consisting of phenol, bisphenol, phloroglucinol, cresols, alkyl phenols, phenol ethers, tannins and lignins, wherein the ratio of aldehyde to phenolic compound is less than one;
   b. a curing agent selected from the group consisting of oxazolidines, imidazolidine-oxazolidine hybrids, and derivatives thereof, and optionally:
   c. a basic accelerator/catalyst;
   d. a reactive diluent;
   e. an inert solvent diluent.

2. The curable phenolic resin of claim 1, wherein the aldehyde is selected from the group consisting of formaldehyde, acetaldehyde, propionaldehyde, cyclohexanedicarboxaldehydes, benzaldehydes, furfural, an aryl aldehyde and a heterocyclic aldehyde.

3. The curable phenolic resin of claim 1, wherein the curing agent is selected from the group consisting of derivatives of oxazolidine, and combinations thereof.

4. The curable phenolic resin of claim 1 wherein the curing agent is an oxazolidine having the following structures:

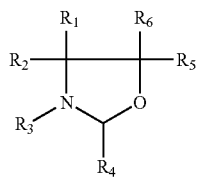

wherein $R_1$ to $R_6$ may be the same or different, selected from H, $C_1$-$C_{12}$ linear or branched alkyl or alkenyl, cycloalkyl, phenyl, substituted aryl, heterocyclic, hydroxymethyl, hydroxy-terminated polyoxyalkylene, or halogen;

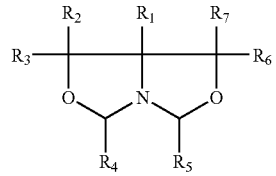

wherein $R_1$ to $R_7$ may be the same or different, selected from H, $C_1$-$C_{12}$ linear or branched alkyl or alkenyl, cycloalkyl, phenyl, substituted aryl, heterocyclic, hydroxymethyl, hydroxy-terminated polyoxyalkylene, or halogen;

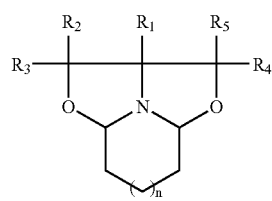

wherein n is an integer from 1 to 6, and $R_1$ to $R_5$ may be the same or different, selected from H, $C_1$-$C_{12}$ linear or branched alkyl or alkenyl, cycloalkyl, phenyl, substituted aryl, heterocyclic, hydroxymethyl, hydroxy-terminated polyoxyalkylene, or halogen; or

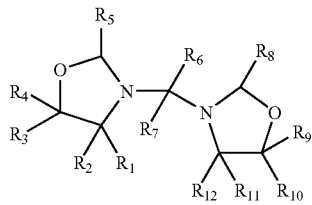

wherein $R_1$ to $R_{12}$ may be the same or different, selected from H, $C_1$-$C_{12}$ linear or branched alkyl or alkenyl, cycloalkyl, phenyl, substituted aryl, heterocyclic, hydroxymethyl, hydroxy-terminated polyoxyalkylene, or halogen.

5. The curable phenolic resin composition of claim 1, wherein the oxazolidine is selected from the group of oxazoladine derivatives consisting of 4-ethloxazolidine (AB-OX), 3-oxazolidineethanol (3OE), 3-phenyloxazolidine (3POX), 3,3'-methlenebisoxazoladine (bis-OX), 1-aza-2,7 dioxabicyclo[3.3.0]octane (SER-OX), 5-(2-furyl)-3-ethyl-3-hydroxymethyl-oxazoladine (FUR/monoZE), and 5-ethyl-1,8-dis(2-furyl)-1-aza-3,7-dioxabicyclo [3.3.0] octane (FUR/ZE), and mixtures thereof.

6. The curable phenolic resin of claim 1, wherein the curing agent is an imidazolidine-oxazolidine hybrid having the following structure:

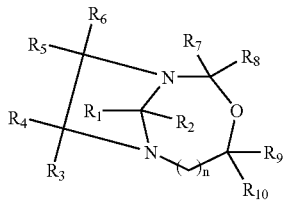

wherein n is an integer from 1 to 6, and $R_1$ to $R_{10}$ may be the same or different, selected from H, $C_1$-$C_{12}$ linear or branched alkyl or alkenyl, cycloalkyl, cycloalkenyl, phenyl, substituted aryl, heterocyclic, hydroxymethyl, hydroxy-terminated polyoxyalkylene, or halogen.

7. The curable phenolic resin of claim 6, wherein the imidazolidine-oxazolidine hybrid is selected from the group consisting of 1-oxo-3,5-diaza[1.2.4]bicyclononane (ODB).

8. The curable phenolic resin of claim 3 wherein the curing agent comprises an oxazolidine selected from the group consisting of 4-ethloxazolidine (AB-OX), 3-oxazolidineethanol (3OB), 3-phenyloxazolidine (3POX), 3,3'-methlenebisoxazoladine (bis-OX), 1-aza-2,7 dioxabicyclo[3.3.0]octane (SER-OX), 5-(2-furyl)-3-ethyl-3-hydroxymethyl-oxazoladine (FUR/monoZE), and 5-ethyl-1, 8-dis(2-furyl)-1-aza-3,7-dioxabicyclo[3.3.0]octane (FUR/ZE), and mixtures thereof.

9. The curable phenolic resin of claim 3, wherein the curing agent comprises an imidazolidine-oxazolidine hybrid selected from the group consisting of 1-oxo-3,5-diaza[1.2.4] bicyclononane (ODB).

10. The curable phenolic resin of claim 1, wherein the basic inorganic accelerator/catalyst is selected from the group consisting of sodium hydroxide, potassium hydroxide, lithium hydroxide, magnesium hydroxide, and calcium oxide.

11. The curable phenolic resin of claim 1, wherein the basic organic accelerator/catalyst is selected from the group consisting of trimethylamine (TMA), triethylamine (TEA), 2-(dimethylamino)-2-(hydroxymethyl)-1,3-propanediol (DMTA), 1,1,3,3-tetramethylguanidine (TMG), tetramethylammonium hydroxide, 1,4-diazabicyclo[2.2.2]octane (Dabco™), 1,8-diazabicyclo[5.4.0]undec-7-ene (DBU), 1,5-diazabicyclo[4.3.0]non-5-ene (DBN), or metal alkoxides such as but not limited to sodium methoxide, sodium ethoxide, potassium methoxide, potassium ethoxide, potassium t-butoxide, sodium phenoxide, and potassium phenoxide.

12. The curable phenolic resin of claim 1, wherein the reactive diluent is selected from the group consisting of aniline, substituted anilines, phenol, substituted phenols, furfuryl alcohol, and furfural.

13. The curable phenolic resin of claim 1, wherein the inert solvent diluent is selected from the group consisting of water, methanol, ethanol, 1-propanol, 2-propanol, ethylene glycol, ethylene glycol monomethyl ether, ethylene glycol diethyl ether, and benzyl alcohol.

14. The curable phenolic resin of claim 1, wherein the curing agent comprises 5-ethyl-1-aza-3,7-dioxabicyclo [3.3.0] octane (ZE), and the inorganic accelerator/catalyst comprises potassium hydroxide.

15. The curable phenolic resin of claim 1, wherein the curing agent comprises 5-ethyl-1-aza-3,7-dioxabicyclo [3.3.0] octane (ZE), and the organic accelerator/catalyst comprises sodium phenoxide.

16. The curable phenolic resin of claim 1, wherein the curing agent comprises 5-ethyl-1-aza-3,7-dioxabicyclo [3.3.0] octane (ZE), and the organic accelerator/catalyst comprises tetramethylammonium hydroxide (TMAOH).

17. The curable phenolic resin of claim 1, wherein the curing agent comprises 3,3'-methlenebisoxazoladine (bis-OX), and the inorganic accelerator/catalyst comprises potassium hydroxide.

18. The curable phenolic resin of claim 1, wherein the curing agent comprises 5-ethyl-1-aza-3,7-dioxabicyclo [3.3.0] ocatane (ZE), the inorganic accelerator/catalyst comprises potassium hydroxide, and the reactive diluent comprises aniline.

19. The curable phenolic resin of claim 1, wherein the curing agent comprises 5-ethyl-1-aza-3,7-dioxabicyclo [3.3.0] ocatane (ZE), and the inert solvent diluent consists of ethanol.

20. The curable phenolic resin of claim 1, wherein the curing agent comprises 3-oxazolidineethanol (3OE), the organic accelerator/catalyst comprises sodium phenoxide, and the reactive diluent comprises m-cresol.

21. The curable phenolic resin of claim 1, wherein the total composition is comprised of between 45-85% by weight of resin derived from the phenolic compound and the aldehyde; between 10-60% by weight of hardener; between 0-10% by weight of accelerator/catalyst; and between 0-25% by weight of reactive diluent.

22. The curable phenolic resin of claim 1, wherein upon curing to form a cured resin, the cured resin is a matrix resin in pultrusion applications.

23. The curable phenolic resin of claim 1, wherein upon curing to form a cured resin, the cured resin is a matrix resin in filament winding applications.

24. The curable phenolic resin of claim 1, wherein upon curing to form a cured resin, the cured resin is a matrix resin in bulk molding compound applications.

25. The curable phenolic resin of claim 1, wherein upon curing to form a cured resin, the cured resin is a matrix resin in sheet molding compound applications.

26. The curable phenolic resin of claim 1, wherein upon curing to form a cured resin, the cured resin is a matrix resin in compression molding applications.

27. The curable phenolic resin of claim 1, wherein upon curing to form a cured resin, the cured resin is a matrix resin in prepreg applications.

28. The curable phenolic resin of claim 3, wherein the curing agent is generated in situ from a mixture of its constituent components.

29. The curable phenolic resin of claim 3, wherein an oxazolidine hardener is generated in situ from a mixture of 2-amino-2-ethyl-1,3-propanediol and formaldehyde 55 wt % solution in methanol.

* * * * *